(12) United States Patent
Aoki et al.

(10) Patent No.: US 7,637,708 B2
(45) Date of Patent: Dec. 29, 2009

(54) PRODUCTION SYSTEM FOR WAFER

(75) Inventors: Toshihiko Aoki, Tokyo (JP); Shunichi Imao, Tokyo (JP); Akihiko Kosugi, Tokyo (JP); Kiichi Uchino, Tokyo (JP)

(73) Assignee: Sumco Corporation, Tokyo (JP)

( * ) Notice: Subject to any disclaimer, the term of this patent is extended or adjusted under 35 U.S.C. 154(b) by 1 day.

(21) Appl. No.: 11/327,336

(22) Filed: Jan. 9, 2006

(65) Prior Publication Data

US 2007/0157878 A1 Jul. 12, 2007

(51) Int. Cl.
  *B65H 1/00* (2006.01)
(52) U.S. Cl. .................... 414/222.07; 414/937
(58) Field of Classification Search ............... 414/416, 414/222.07, 222.01, 937
See application file for complete search history.

(56) References Cited

U.S. PATENT DOCUMENTS

| 5,443,346 | A | * | 8/1995 | Murata et al. | 414/222.13 |
| 5,466,117 | A | * | 11/1995 | Resler et al. | 414/799 |
| 5,588,797 | A | * | 12/1996 | Smith | 414/797.5 |
| 5,807,066 | A | * | 9/1998 | Smith | 414/802 |
| 6,540,869 | B2 | * | 4/2003 | Saeki et al. | 156/345.31 |
| 6,585,470 | B2 | * | 7/2003 | Van Der Meulen | 414/217 |
| 6,663,340 | B1 | * | 12/2003 | Zeakes et al. | 414/788 |
| 6,733,243 | B2 | * | 5/2004 | Ogata et al. | 414/217 |
| 6,758,647 | B2 | * | 7/2004 | Kaji et al. | 414/217 |
| 2003/0218141 | A1 | * | 11/2003 | Queens et al. | 250/492.1 |
| 2004/0091338 | A1 | * | 5/2004 | Kim | 414/217 |
| 2005/0158152 | A1 | * | 7/2005 | Otaguro | 414/217 |
| 2006/0177289 | A1 | * | 8/2006 | Bonora et al. | 414/217 |
| 2006/0182543 | A1 | * | 8/2006 | Schaefer | 414/222.01 |

FOREIGN PATENT DOCUMENTS

| JP | 10-050639 | 2/1998 |
| JP | 2005-085913 | 3/2005 |

OTHER PUBLICATIONS

English Language Abstract of JP 10-050639.
English Language Abstract of JP 2005-085913.

* cited by examiner

*Primary Examiner*—Saúl J Rodríguez
*Assistant Examiner*—Joshua I Rudawitz
(74) *Attorney, Agent, or Firm*—Greenblum & Bernstein P.L.C.

(57) ABSTRACT

The system includes a first conveying vehicle for holding and conveying wafers as products finished with an inspection step from a stock storage shelf group 11 to a reloading device 17, and a second conveying vehicle for holding and conveying a transporting container from a reloading device to a transporting storage shelf group: wherein a traveling course of the first conveying vehicle is provided on one side of the reloading device and a traveling course for the second conveying vehicle is provided on the other side; the reloading device includes a first mounting table for mounting the conveying container, a second mounting table for mounting the transporting container, and a reloading device for reloading wafers in the conveying container mounted on the first mounting table to the transporting container mounted on the second mounting table; and the installed number of the first mounting tables is larger than that of the second mounting tables.

7 Claims, 7 Drawing Sheets

PRODUCTION SYSTEM FOR WAFER

BACKGROUND OF THE INVENTION

1. Field of the Invention

The present invention relates to a production system for wafers.

2. Description of the Related Art

As a system for manufacturing wafer by performing slicing processing on an ingot used as a semiconductor material, for example, one disclosed in the patent article 1 (the Japanese Unexamined Patent Publication No. 10-50639) may be mentioned. The wafer manufacturing system disclosed in the patent article 1 has a number of processes, such as storage of ingots, orientation, plate attachment, slice processing, single-wafer processing cleaning and wafer inspection, and moreover, processing in each process and conveyance therein have been automated.

According to the wafer manufacturing system as above, automation has been attained from manufacturing of wafers to the inspection process including conveyance therein.

But when transporting the wafers as products, they are moved from a conveying container in the factory to a transporting container for transporting to clients and the reloading of wafers has been manually handled.

Since the reloading of wafers is operated manually, the operating efficiency has been poor and automation thereof has been desired.

Note that the wafers are reloaded because the conveying container has a handle for conveying protruding outside and requires space for that, so that it is not economical in terms of space when using it for transporting.

SUMMARY OF THE INVENTION

An object of the present invention is to provide a wafer production system wherein an operation of reloading wafers from a conveying container to a transporting container is also automated.

To attain the above object, according to the present invention, there is provided a production system for wafers having at least a polishing subsystem for polishing wafers cut out from an ingot, an inspection subsystem for inspecting the polished wafers, and a reloading subsystem for reloading the wafers as products produced through the inspection subsystem from a conveying container to a transporting container, comprising a first conveying vehicle for holding and conveying the conveying container from a stock position to a reloading position, and a second conveying vehicle for holding and conveying the transporting container from the reloading position to a transporting position; wherein a traveling route of the first conveying vehicle is provided on one side of the reloading device, and a traveling route of the second conveying vehicle is provided on the other side of the reloading device;

on the reloading device side, a first mounting table for mounting the conveying container, a second mounting table for mounting the transporting container, and a reloading device for reloading wafers in the conveying container mounted on the first mounting table to a transporting container mounted on the second mounting table are provided; and the installed number of the first mounting tables is larger than that of the second mounting tables.

Also, in the wafer production system according to present invention, an overhead traveling type vehicle is used as the first conveying vehicle and a land traveling type vehicle is used as the second conveying vehicle.

Furthermore, in the wafer production system according to the present invention, the second conveying vehicle comprises a container cradle for loading a plurality of conveying containers.

According to the above production system, a conveying container carrying wafers is conveyed from the stock position to a reloading position by a first conveying vehicle, and the wafers in the conveying container are reloaded to a transporting container and conveyed to a transporting position by a second conveying vehicle, so that a reloading operation of wafers from a conveying container to a transporting container required at the time of transporting can be automated and, moreover, since the installed number of the first mounting tables for reloading is larger than that of the second mounting tables, wafers in the smaller number than a capacity of the conveying container due to generation of defectives up to the inspection step can be effectively reloaded to the transporting container. Furthermore, the second conveying vehicle is provided with a plurality of container cradles, so that transporting containers can be conveyed efficiently.

The present disclosure relates to subject matter contained in Japanese Patent Application No. 2003-314858, filed on Sep. 8, 2003, the disclosure of which is expressly incorporated herein by reference in its entirety.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, the wafer production system according to an embodiment of the present invention will be explained based on FIG. 1 to FIG. 7.

The wafer production system is for producing a wafer for a semiconductor substrate, for example, by slicing a cylindrical ingot made by silicon and includes at least an ingot block cutting step, a slicing step, a roughly polishing step (wrapping step), an etching step, a mirror polishing step (polishing step), an inspection step and, furthermore, a reloading step for moving wafers as completed products finished with the inspection step from a conveying container thereof to a transporting container; and, in the present invention, the reloading step is also automated.

Below, the production system according to the present embodiment will be explained by focusing on the reloading step.

Figure 1A:
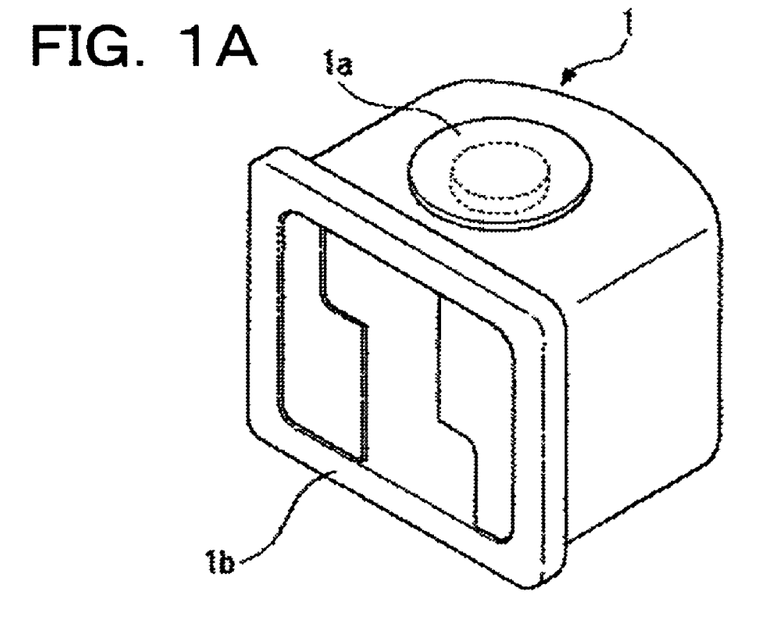
FIG. 1A is a perspective view of a conveying container of wafers used in the wafer production system according to an embodiment of the present invention.
Figure 1B:
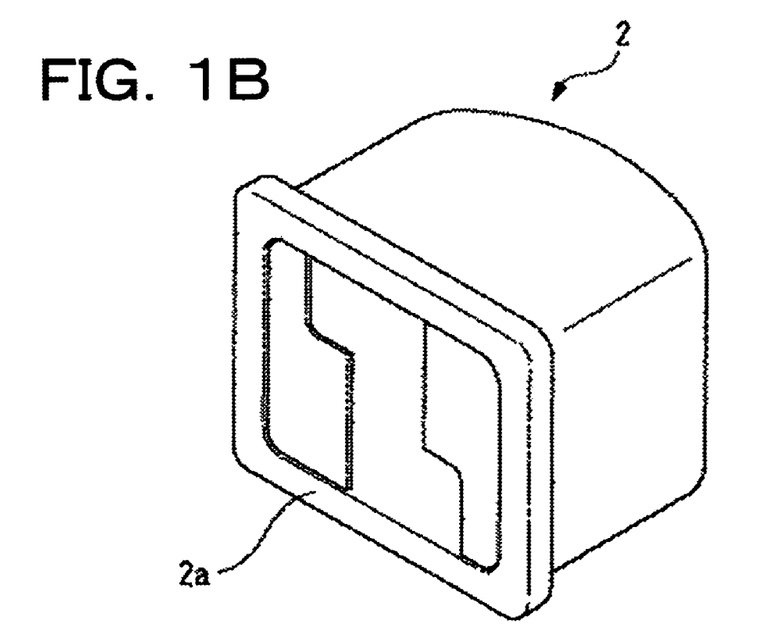
FIG. 1B is a perspective view of a transporting container of wafers used in the wafer production system according to an embodiment of the present invention.

First, the necessity of reloading the wafers will be plainly explained. An overhead traveling type first conveying vehicle (which will be explained later on) is used for conveying wafers between steps. Therefore, as shown in FIG. 1A, as a conveying container for holding and carrying a plurality of wafers, an article conveying container 1 (also called a hoop and referred to as a conveying container below) provided with an engaging protrusion 1a (engagement portion) for freely engaging with or being removed from a holder suspending from the overhead traveling type conveying vehicle and capable of holding articles under production is used. When wafers in such a lofty container are shipped to clients, it is not economical in terms of space. Accordingly, as shown in FIG. 1B, a product transporting container 2 (referred to as a transporting container below) not provided with an engaging protrusion on its top is used as a transporting container. Therefore, as a final step, a reloading step for reloading wafers from the conveying container 1 to the transporting container 2 is provided. Note that since the transporting container 2 is not provided with an engaging protrusion, it is conveyed by a land traveling type second conveying vehicle (which will be explained later on). Both of the containers 1 and 2 have a storage room for storing the same number of wafers, and covers 1b and 2a for the storage rooms are provided on their side portions, respectively.

Next, based on FIG. 2 and FIG. 3, the schematic configuration around a final line in the production system will be explained.

Around the final line, a stock storage shelf group (stock position) 11 for temporarily stocking wafers finished with the inspection step in a state of being held in the conveying container 1 is provided, and a transporting storage shelf group (transporting position) 12 for temporarily storing the transporting containers 2 holding wafers reloaded from the conveying containers 1 in the reloading step before transporting is provided near the stock storage shelf group 11.

Note that loading and unloading of the containers 1 and 2 on and from the storage shelf groups 11 and 12 have been automated, and on paths between the storage shelves 11a and 11a and storage shelves 12a and 12a in the storage shelf groups 11 and 12, automotive loading/unloading devices (also referred to as stacker cranes) 15 and 16 for exchanging containers (loading and unloading operations) between respective storage rooms arranged three-dimensionally and temporary tables 13 and 14 of containers arranged at respective ends of the paths.

At a plurality of positions (for example six positions) close to the both storage shelf groups 11 and 12 (corresponding to reloading positions), reloading devices 17 for moving wafers from the conveying container 1 to the transporting container 2 are provided, a guide rail (traveling course) 4 in a ring shape (loop shape) for the first conveying vehicle 3 to travel is provided over the reloading devices 17 and the storage shelf groups 11 and 12, and a plurality of second conveying vehicles 5 freely running on the floor between the reloading devices 17 and the transporting storage shelf group 12 are also provided. Note that, in FIG. 2, the reference number 6 is the guide rail provided on the ceiling to guide a similar conveying vehicle as the first conveying vehicle 3 for conveying wafers finished with the inspection step in a state of being carried in the conveying container 1 to the stock storage shelf group 11.

Figure 2:
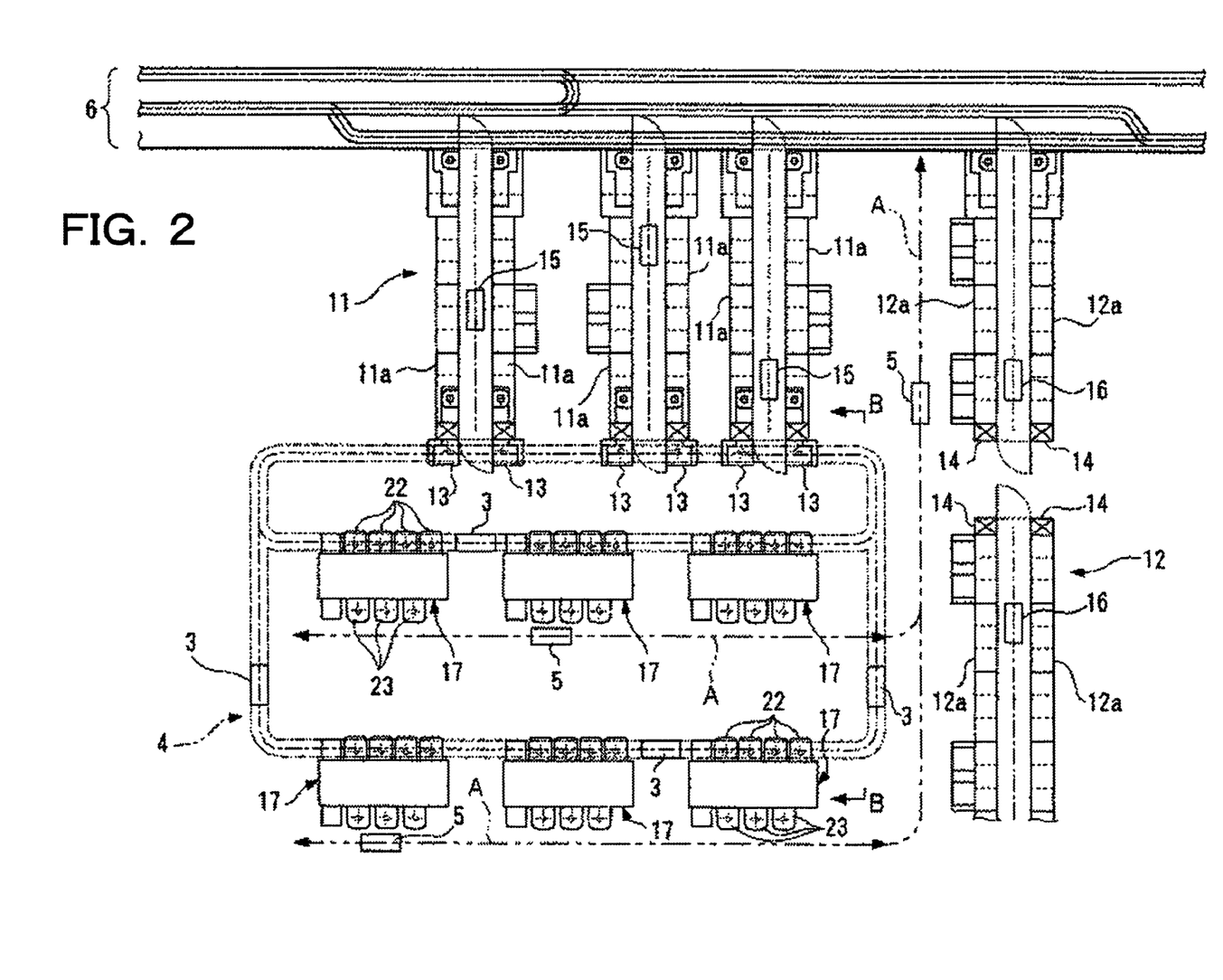
FIG. 2 is a plan view of a key part in the production system.
Figure 3:
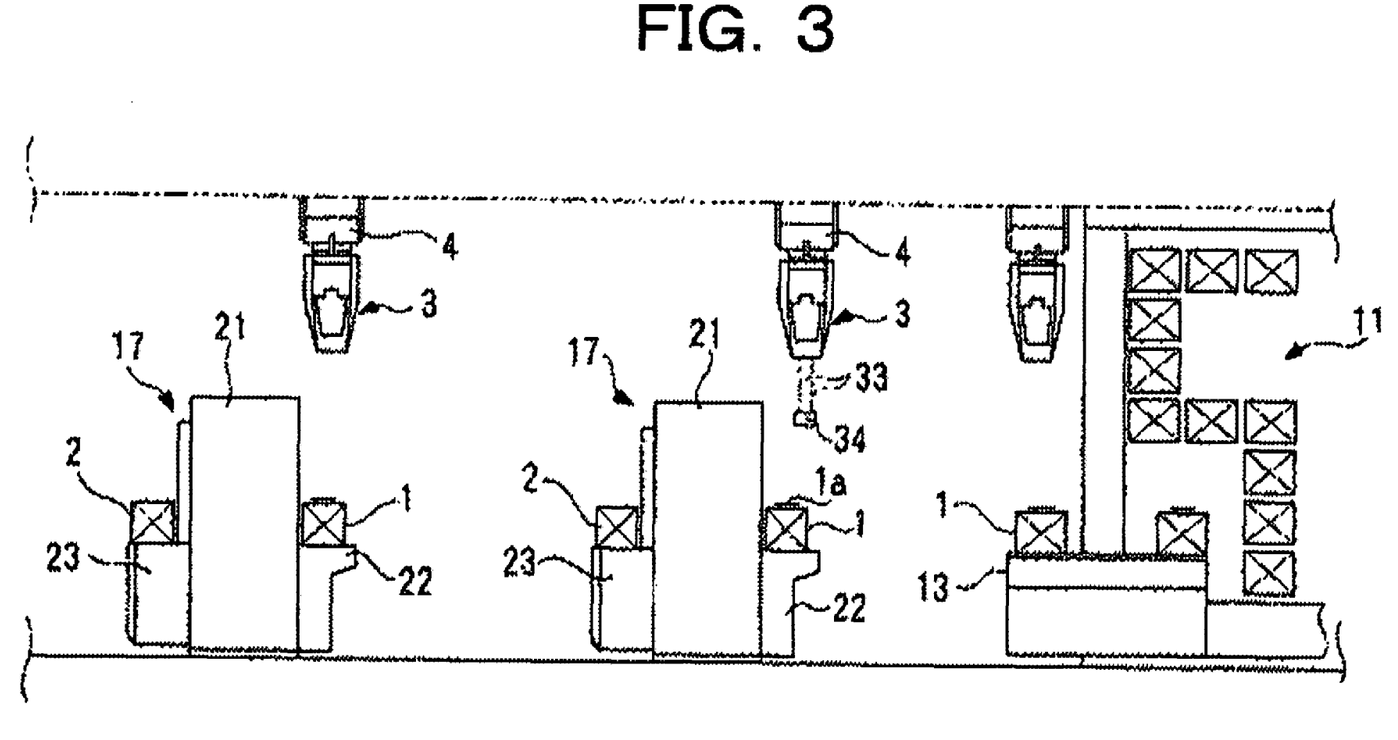
FIG. 3 is a sectional view along a line B-B in FIG. 2.

Each of the reloading device 17 is, as shown in FIG. 2 and FIG. 3, composed of a device body 21 provided with a robot device (not shown) as a reloading device for reloading wafers by holding them at its center, a first mounting table 22 arranged on one side of the device body 21 and for being mounted with a conveying container 1, and a second mounting table 23 arranged on the other side of the device body 21 and for mounting a transporting container 2. It is needless to mention but the guide rail 4 as a traveling course of the first conveying vehicle 3 passes above the first mounting table 22 arranged on one side of the reloading device 17, and a traveling course of the second conveying vehicle 5 passes immediately near the second mounting table 23 arranged on the other side.

The number of the first mounting table 22 is, for example, four, while the number of the second mounting table 23 is smaller than that of the first mounting table 22, for example, three. Note that, on the reloading device 17 side, an opening/closing device (not shown) for opening or closing the cover 1b of the conveying container 1 mounted on the first mounting table 22 is provided, similarly, an opening/closing device (not shown) for opening or closing the cover 2a of the transporting container 2 mounted on the second mounting table 23 is provided.

When the conveying container 1 carried by the first conveying vehicle 3 is mounted on the first mounting table 22, the cover 1b is opened by the opening/closing device, then, the carried wafers are taken out one by one by the robot device and mounted on the second mounting table 23, and housed in the transporting container 2 with its cover 2a open. After all wafers are taken out from the conveying container 1, the cover 1b is automatically closed by the opening/closing device. As to the transporting container 2 mounted on the second mounting table 23, opening/closing of the cover 2a is automatically performed by the opening/closing device provided on the second mounting table 23 side.

Next, the first conveying vehicle 3 and second conveying vehicle 5 will be explained plainly.

Figure 4:
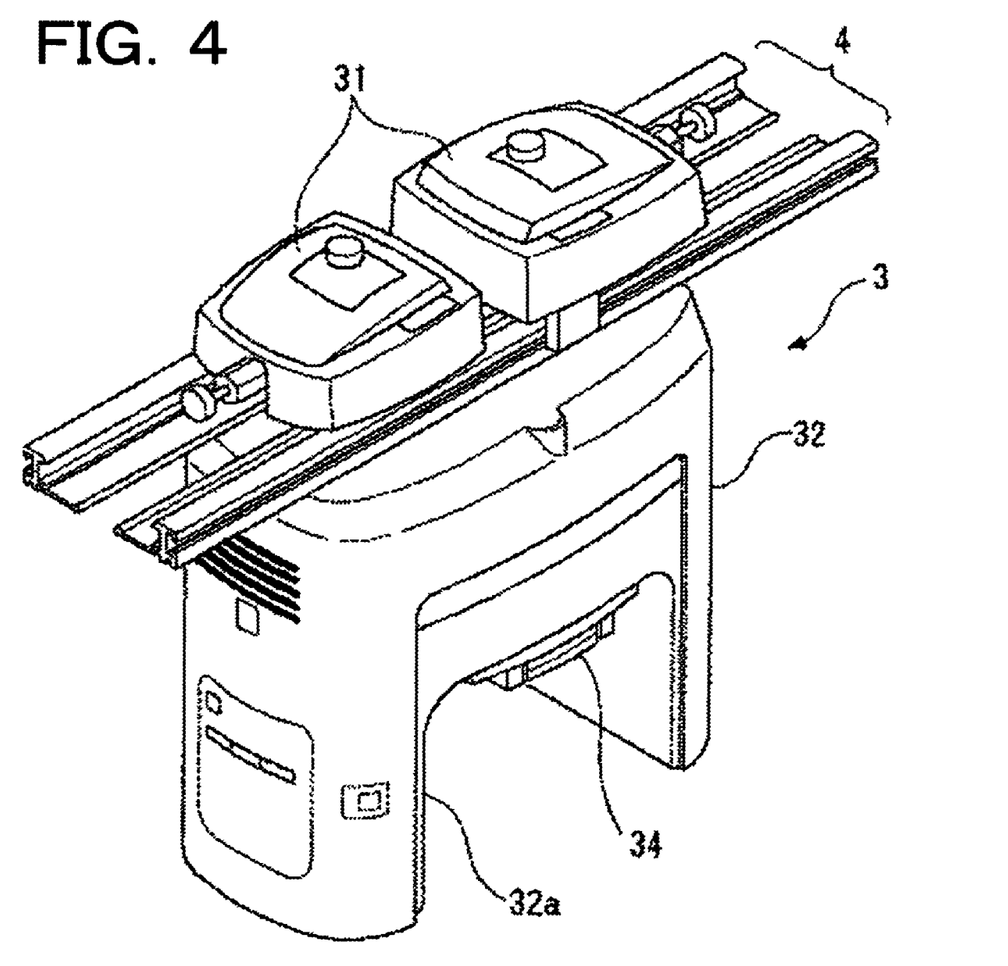
FIG. 4 is a perspective view of a first conveying vehicle used in the production system.

The overhead traveling type first conveying vehicle 3 is, as shown in FIG. 3 and FIG. 4, composed of a drive unit 31 having drive wheels for running by being guided by the guide rail 4 provided on the ceiling, a vehicle body 32 held by being suspended from the drive 31 and having a storage 32a for holding a conveying container 1 at its center, an elevating member (for example, a belt is used) 33 provided to be able to freely move vertically from the upper surface of the storage 32a of the vehicle body 32, and a holding member 34 provided to the lower end of the elevating member 33 to be freely engaged with or removed from an engaging protrusion 1a of the conveying container 1.

Figure 5:
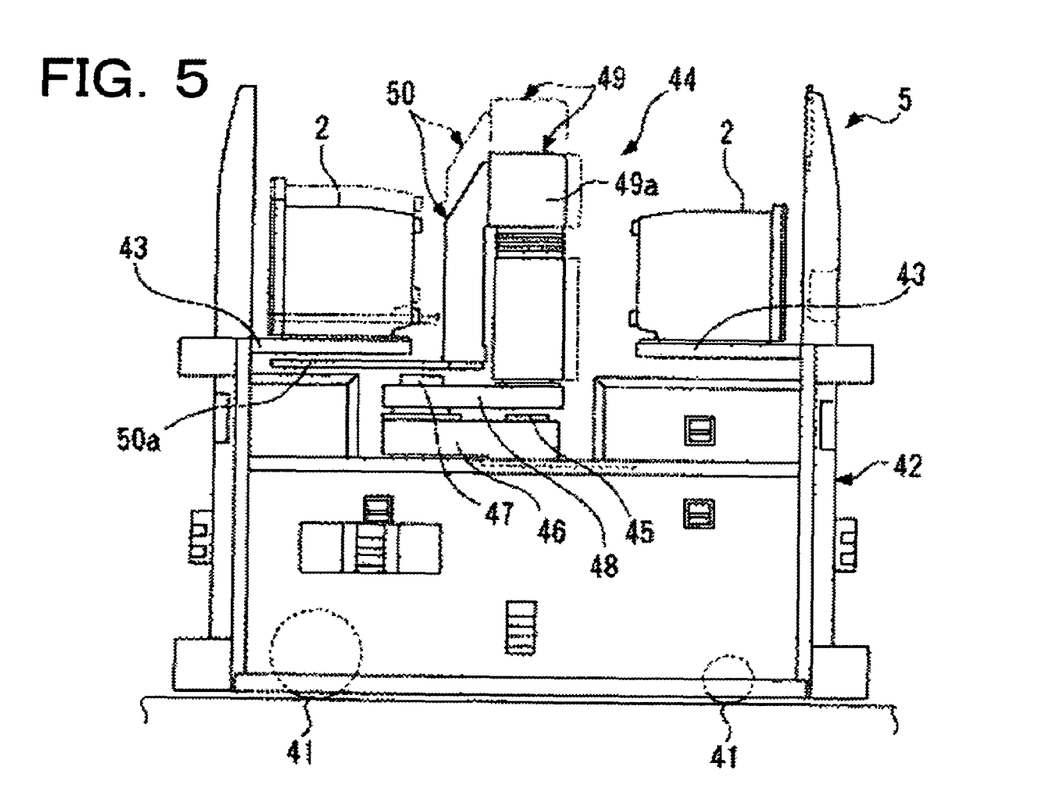
FIG. 5 is a view from the front of a second conveying vehicle used in the production system.
Figure 6:
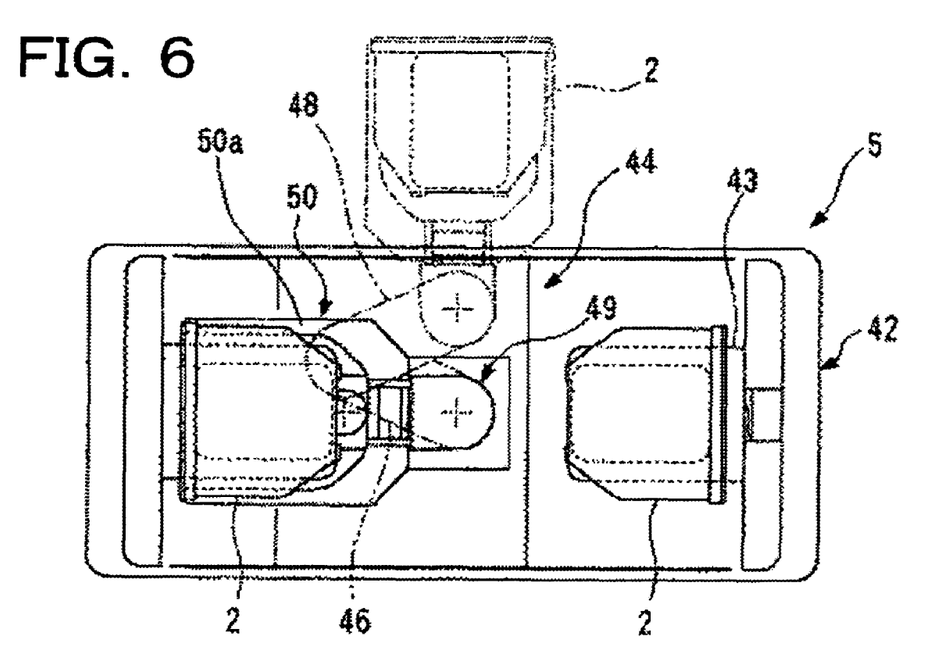
FIG. 6 is a plan view of the second conveying vehicle.
Figure 7:
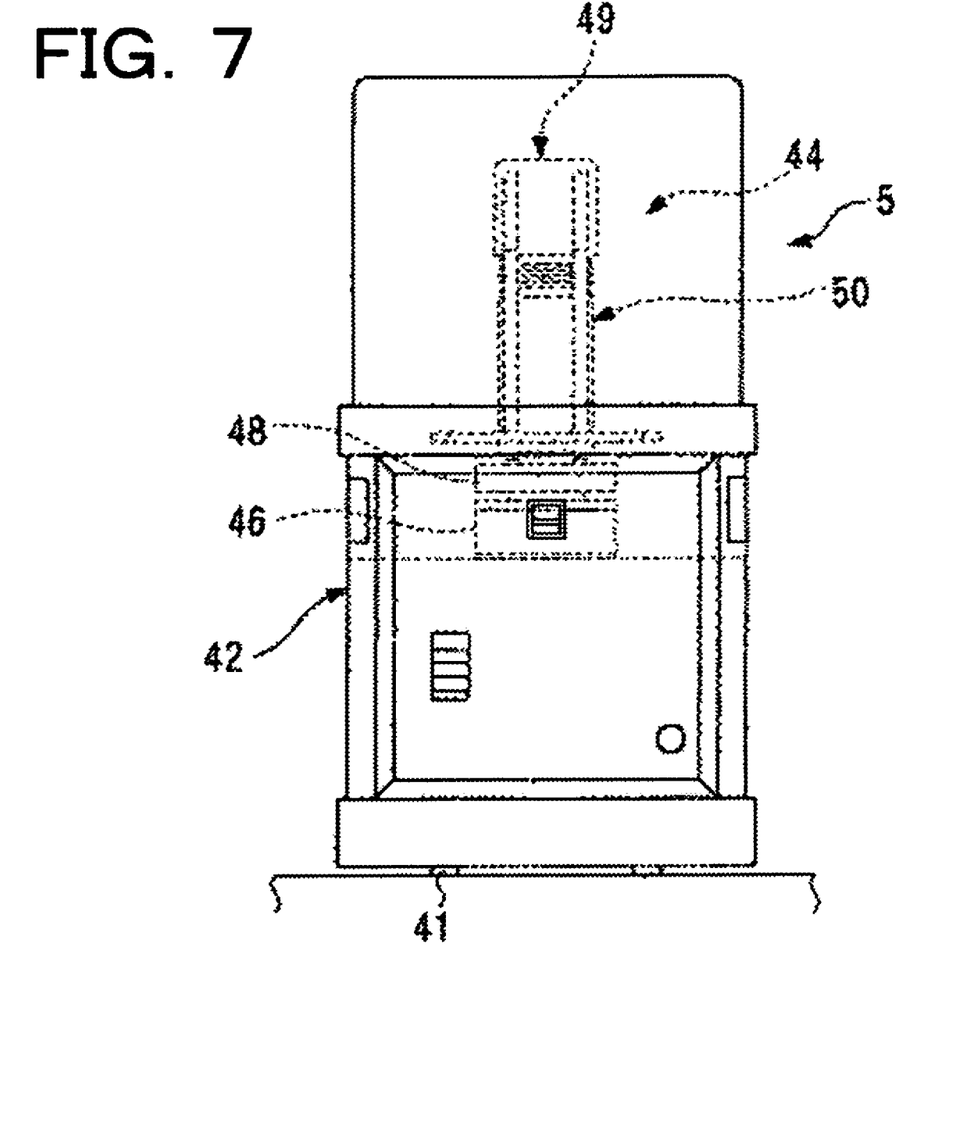
FIG. 7 is a view from the left side of the second conveying vehicle.

The land traveling type second conveying vehicle 5 is, as shown in FIG. 5 to FIG. 7, composed of an automotive vehicle body 42 having drive wheels for freely running along a predetermined course A (shown in FIG. 2) on the floor, container cradles 43 for transporting containers 2 positioned on the front portion and the rear portion of the upper surface of the vehicle 42, and a reloading robot device 44 provided at the center of the vehicle body 42 for giving and receiving transporting containers 2 to/from the second mounting table 23 on the reloading device 17 side from/to the container cradle 43.

The reloading robot device 44 is composed of a first arm 46 provided to be rotatable on a horizontal plane via a first rotation axis 45 provided at an upper portion of the vehicle body 42 to be rotatable around a vertical axis center, a second arm body 48 provided in the same way to be rotatable on the horizontal plane via a second rotation axis 47 provided at an end of the first arm body 46 to be rotatable around the vertical axis center, an elevator (for example, an electromotive device is used therein) 49 attached to an end portion of the second arm 48, and an L-shaped support member 50 for a transporting container 2 attached to the elevating/lowering portion 49a side of the elevator 49. Note that, while not illustrated, a rotation drive (not shown and, for example, an electromotive device is used) for rotating the respective arms by rotating the rotation axes 45 and 47 is provided. Also, it is configured that as a result that a horizontal portion 50a of the support member 50 supports the bottom surfaces of the transporting containers 2 mounted on the second mounting table 23 and on the container cradle 43 and the reloading device 17, the transporting containers 2 are lifted and mounted on the container cradle 43 and the second mounting table 23. For example, the horizontal portion 50a of the support member 50 is formed to be a plate shape having a predetermined width, and the opposing container cradle 43 and the second mounting table 23 are formed to have a two-forked shape so as to be able to penetrate the horizontal portion 50a in the vertical direction.

Accordingly, when moving a transporting container 2 mounted on the second mounting table 23 on the reloading device 17 side to the second conveying vehicle 5 side, by a rotation operation of the first arm 46 and the second arm 48, as indicated by a virtual line in FIG. 6, the horizontal portion 50a is rotated by 90 degrees so as to be protrude from the second conveying vehicle 5 side to the reloading device 17 side, then, the horizontal portion 50a is brought to protrude beneath the second mounting table 23.

Next, the support member 50 is elevated by the elevator 49, so that the horizontal portion 50a lifts the transporting container 2 mounted on the second mounting table 23 upwardly to hold it.

Next, after taking in the support member 50 by a rotation operation of the arms 46 and 48, the transporting container 2 is moved to a predetermined container cradle 43, the elevator 49 lowers the support member 50, and the transporting container 2 is mounted on the container cradle 43, consequently, a reloading operation of the transporting container 2 completes.

Inversely, when moving the transporting container 2 from the second conveying vehicle 5 to the reloading device 17 side, an inverse procedure of the above can be performed. This is, for example, for the case of supplying an empty transporting container 2 to the reloading device 17 side.

Next, a wafer reloading step will be explained.

Wafers as products finished with the inspection step are carried in a state of being held in a conveying container 1 by a conveying vehicle (not shown) traveling along the guide rail 6 and temporarily stocked on any one of stock storage shelves 11a of the stock storage shelf group 11 via the loading/reloading device 15.

When reloading wafers from the conveying container 1 stored in the stock storage shelf group 11 to a transporting container 2, an instruction indicating that wafers in a conveying container 1 stored on which stock storage shelf 11a are reloaded to the transporting container by which reloading device 17 is output from a control device for controlling the reloading step outputs to a predetermined device and equipment. On the reloading device 17 side, an empty transporting container 2 for the reloading is supplied to the second mounting table 23 by a second conveying vehicle 5 and the cover 2a is open.

In this state, a first conveying vehicle 3 traveling along the guide rail 4 provided on the reloading step side holds a conveying container 1 mounted on a temporary table 13 of a predetermined stock storage shelf 11a. For example, four of the conveying containers 1 are successively carried by four first conveying vehicles 3. At this time, on three second mounting tables 23 provided on the opposite side, transporting containers 2 are mounted with their covers 2a open in the same way.

Then, after the first conveying vehicles 3 travels to predetermined reloading devices, the respectively carried conveying containers 1 are put on the first mounting tables 22, respectively.

A cover 1b of each of the conveying containers 1 is opened by an opening/closing device.

After that, a robot device as a reloading device takes out wafers in the conveying container 1 one by one and places them in a transporting container 2 mounted on the second mounting table 23, so that the wafers are reloaded.

Normally, the conveying container 1 is not fully filled with wafers and the number of the wafers is smaller exactly by the number of defective wafers generated up to the final inspection step.

Accordingly, the robot device as a reloading device reloads wafers from four conveying containers 1 to three transporting containers 2 in order.

When at least two transporting containers 2 are filled up, based on information from the reloading device 17, an empty second conveying vehicle 5 is called up and two transporting containers 2 are placed on both container cradles 43 by the reloading robot device 44.

When the reloading completes, the second conveying vehicle 5 travels to a position of a transporting storage shelf 12a with an empty storage room and the transporting container 2 is unloaded on the temporary table 14. The transporting container 2 placed on the temporary table 14 is stored on a predetermined transporting storage shelf 12 by the loading/unloading device 16. Also, when the third transporting container 2 becomes full, another second conveying vehicle 5 conveys a transporting container 2. Note that emptied conveying containers 1 are collected to a predetermined place by first conveying vehicles 3 and used again for conveying wafers in respective production steps.

As explained above, a conveying container 1 temporarily stocked in the stock storage shelf group 11 is carried by an overhead traveling type first conveying vehicle 3 to a reloading device 17 provided at a predetermined position, placed on a first mounting table 22, reloaded to a transporting container 2 placed on the second mounting table 23 of the reloading device 17 by a robot device, then, loaded on a land traveling second conveying vehicle 5 side to be carried to a transporting storage shelf 12a and stored; so that the reloading operation of wafers from the conveying container 1 to the transporting container 2 required at transporting can be automated.

Particularly, in the reloading operation, that is, in the reloading device 17, the number of installed first mounting tables 22 is larger than that of the second mounting tables 23, so that wafers to be conveyed in the smaller number than the container capacity due to defectives generated up to the inspection step can be effectively reloaded to transporting containers 2.

Furthermore, as a result of providing a plurality of container cradles 43 to the second conveying vehicle 5, the transporting containers 2 can be conveyed efficiently.

In the above embodiment, the reloading device 17 is provided with four first mounting tables 22 and three second mounting tables 23, but the present invention is not limited to this and the numbers may be any as far as the number of mounting tables for the conveying containers 1 is larger than that of the transporting containers 2.

Also, in the reloading step, the case of unloading four conveying containers 1 on the first mounting tables 22 was explained, but when the number of the transporting containers 2 is small, conveying containers 1 in the corresponding number are unloaded on the first mounting tables 22.

The embodiment explained above is for easier understanding of the present invention and not to limit the present invention. Accordingly, respective elements disclosed in the above embodiments include all modifications in designs and equivalents belonging to the technical field of the present invention.

What is claimed is:

1. A production system for wafers, comprising:
a polishing subsystem for polishing wafers cut out from an ingot;
an inspection subsystem for inspecting the polished wafers; and
a reloading subsystem for reloading the wafers as products produced through the inspection subsystem from a conveying container having a movable cover affixed thereto and configured to cover storage space inside the conveying container, to a transporting container having a movable cover affixed thereto and configured to cover storage space inside the transporting container, the transporting container structurally different from the conveying container, the reloading system comprising:
a first conveying vehicle for holding and conveying said conveying container holding the wafers as products produced through the inspection subsystem from a stock position to a reloading position;
a second conveying vehicle for holding and conveying said transporting container from said reloading position to a transporting position;
a reloading device provided at said reloading position;
a traveling course of said first conveying vehicle provided on one side of said reloading device; a traveling course of said second conveying vehicle provided on the other side of said reloading device;
a plurality of first mounting tables provided to said reloading device for mounting said conveying container;
at least one second mounting table provided to said reloading device for mounting said transporting container; and
a reloading device for reloading wafers in a conveying container mounted on said plurality of first mounting tables to a transporting container mounted on said at least one second mounting table;
a first opening and closing device mounted on the plurality of first mounting table tables and configured to open and close the movable cover of the conveying container; and
a second opening and closing device mounted on the at least one second mounting table and configured to open and close the movable cover of the transporting container,
wherein the installed number of said plurality of first mounting tables is larger than that of said at least one second mounting table.

2. The production system for wafers as set forth in claim 1, wherein said first conveying vehicle is an overhead traveling type vehicle and said second conveying vehicle is a land traveling type vehicle.

3. The production system for wafers as set forth in claim 1, wherein said second conveying vehicle comprises container cradles for loading a plurality of conveying containers.

4. The production system for wafers as set forth in claim 2, wherein said second conveying vehicle comprises container cradles for loading a plurality of conveying containers.

5. The production system for wafers as set forth in claim 1, wherein the traveling course of said first conveying vehicle is provided in a loop shape between the reloading position and the transporting position.

6. The production system for wafers as set forth in claim 1, wherein a plurality of the second conveying vehicles are also provided on the traveling course between the reloading device and the transporting position.

7. The production system for wafers as set forth in claim 1, wherein the first conveying vehicles convey emptied conveying containers on the plurality of first mounting tables to a predetermined place along the traveling course of the first conveying vehicle.

* * * * *